(12) United States Patent
Kaplan et al.

(10) Patent No.: US 9,577,020 B2
(45) Date of Patent: *Feb. 21, 2017

(54) ORGANIC LIGHT-EMITTING DISPLAY DEVICE

(71) Applicant: Samsung Display Co., Ltd., Yongin, Gyeonggi-Do (KR)

(72) Inventors: Len Kaplan, Yongin (KR); Valeriy Prushinskiy, Yongin (KR); Se-Ho Cheong, Yongin (KR); Won-Sik Hyun, Yongin (KR); Byoung-Seong Jeong, Yongin (KR); Jang-Seok Ma, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/721,790

(22) Filed: May 26, 2015

(65) Prior Publication Data

US 2015/0263080 A1 Sep. 17, 2015

Related U.S. Application Data

(62) Division of application No. 13/412,477, filed on Mar. 5, 2012, now Pat. No. 9,041,017.

(30) Foreign Application Priority Data

Mar. 21, 2011 (KR) .................. 10-2011-0024993

(51) Int. Cl.
*H01L 27/32* (2006.01)
*H01L 51/52* (2006.01)

(52) U.S. Cl.
CPC ....... *H01L 27/3276* (2013.01); *H01L 27/3248* (2013.01); *H01L 51/5281* (2013.01); *H01L 51/5284* (2013.01)

(58) Field of Classification Search
CPC ............. H01L 51/5284; H01L 51/5281; H01L 27/3248; H01L 27/3276
(Continued)

(56) References Cited

U.S. PATENT DOCUMENTS 7,282,855 B2  10/2007  Park et al.
8,212,280 B2   7/2012  Ikeda et al.
(Continued)

FOREIGN PATENT DOCUMENTS

CN     1702532 A    11/2005
JP  2003-123965 A    4/2003
(Continued)

OTHER PUBLICATIONS

O.S. Heavens, Optical properties of thin solid films, 1991, Dover Publications, Inc. pp. 207-219.*

(Continued)

*Primary Examiner* — William F Kraig
*Assistant Examiner* — Pavel Ivanov
(74) *Attorney, Agent, or Firm* — Knobbe Martens Olson & Bear LLP

(57) ABSTRACT

An organic light-emitting display device includes a first substrate and a second substrate that face each other; an organic light-emitting device that is disposed between the first and second substrates and includes a pixel electrode separately formed in each pixel, a common electrode facing the pixel electrode, and an organic light-emitting layer disposed between the pixel electrode and the common electrode; and an electrode unit and at least one wiring unit that are disposed between the first substrate and the second substrate, the electrode unit including at least one thin-film transistor for transmitting a light-emitting signal to the pixel electrode and at least one capacitor, wherein an optical property modification layer obtained by modifying an opti- (Continued)

cal property of at least one of the electrode unit and the wiring unit is formed on a surface of the at least one of the electrode unit and the wiring unit.

17 Claims, 11 Drawing Sheets

(58) Field of Classification Search
USPC .................................................. 257/88, 40
See application file for complete search history.

(56) References Cited

U.S. PATENT DOCUMENTS

| | | |
|---|---|---|
| 2003/0016196 A1 | 1/2003 | Lueder et al. |
| 2003/0067266 A1 | 4/2003 | Kim et al. |
| 2003/0107326 A1 | 6/2003 | Park et al. |
| 2003/0227021 A1 | 12/2003 | Yamazaki et al. |
| 2005/0067378 A1 | 3/2005 | Fuerhaupter et al. |
| 2005/0110388 A1 | 5/2005 | Takeuchi |
| 2005/0263761 A1 | 12/2005 | Kim et al. |
| 2005/0263775 A1 | 12/2005 | Ikeda et al. |
| 2008/0216926 A1 | 9/2008 | Guo et al. |
| 2008/0218067 A1 | 9/2008 | Lee et al. |
| 2010/0148204 A1 | 6/2010 | Ikeda et al. |
| 2011/0204370 A1 | 8/2011 | Yoon et al. |

FOREIGN PATENT DOCUMENTS

| | | |
|---|---|---|
| JP | 2003-280555 A | 10/2003 |
| JP | 2005-158665 A | 6/2005 |
| JP | 2005-339927 A | 12/2005 |
| JP | 2006-195317 A | 7/2006 |
| JP | 2008-071578 A | 3/2008 |
| JP | 2008-277161 A | 11/2008 |
| JP | 2010-160943 A | 7/2010 |
| KR | 10-2003-0044744 A | 6/2003 |
| KR | 10-2005-0012958 A | 2/2005 |
| KR | 10-2005-0119894 A | 12/2005 |

OTHER PUBLICATIONS

Young. Hugh D. and Freedman Roger A., University Physics; Pierson; 2008; 12th Edition; pp. 1223-1224.*
Office Action dated Jul. 28, 2015 of corresponding Japanese Patent Application No. 2011-259342—5 pages.
Office Action dated Jul. 28, 2015 of corresponding Chinese Patent Application No. 201210073038.2—11 pages.
Young. Hugh D. and Freedman Roger A., University Physics; Pierson; 12th Edition; pp. 1223-1224.
Granted Documents dated Apr. 13, 2016 of corresponding Chinese Patent Application No. 201210073038.2—23 pages.

* cited by examiner

ORGANIC LIGHT-EMITTING DISPLAY DEVICE

CROSS-REFERENCE TO RELATED PATENT APPLICATION

This application is a divisional of U.S. patent application Ser. No. 13/412,477, filed Mar. 5, 2012, which claims the benefit of Korean Patent Application No. 10-2011-0024993, filed on Mar. 21, 2011, in the Korean Intellectual Property Office, the disclosures of which are incorporated herein in their entirety by reference.

BACKGROUND

1. Field

The present disclosure relates to an organic light-emitting display device, and more particularly, to an organic light-emitting display device that may minimize the reduction in contrast caused by reflection of external light.

2. Description of the Related Art

Organic light-emitting display devices, which are self-emitting display devices, have advantages of wide viewing angles and fast response times. However, the organic light-emitting display devices have disadvantages in that if the organic light-emitting display devices display images in an external light environment, the external light is reflected by metal materials for constituting electrodes and wires in the organic light-emitting display devices, thereby reducing contrast.

In general, in order to minimize the reduction in contrast, a polarization plate, which is expensive, may be used. However, the use of such a polarization plate may increase costs, reduce a transmittance because light emitted from a light-emitting layer is blocked, and reduces brightness.

In order to minimize the reduction in contrast, a black matrix may be formed on electrodes or wires. However, the use of such a black matrix may require an additional masking process to form the black matrix, which makes a manufacturing process complex.

SUMMARY

An aspect of the present invention provides an organic light-emitting display device that may improve contrast by modifying the optical properties of surfaces of an electrode unit and a wiring unit.

According to an aspect of the present invention, there is provided an organic light-emitting display device including: a first substrate and a second substrate that face each other; an organic light-emitting device that is disposed between the first and second substrates and includes a pixel electrode separately formed in each pixel, a common electrode facing the pixel electrode, and an organic light-emitting layer disposed between the pixel electrode and the common electrode; and an electrode unit and at least one wiring unit that are disposed between the first substrate and the second substrate, the electrode unit including at least one thin-film transistor configured to transmit a light-emitting signal to the pixel electrode and at least one capacitor, wherein an optical property modification layer having an optical property modified from that of at least one of the electrode unit and the wiring unit is formed on a surface of the at least one of the electrode unit and the wiring unit.

The optical property modification layer may have a reflectance that is lower than a reflectance of each of the electrode unit and the at least one wiring unit.

The optical property modification layer may have a light-absorptance that is higher than a light-absorptance of each of the electrode unit and the at least one wiring unit.

The optical property modification layer may be different from the at least one of the electrode unit and the wiring unit in terms of at least one optical property selected from the group consisting of a transmittance, a refractive index, a diffraction, and a color.

The optical property modification layer may be formed by applying femtosecond-duration laser beam pulses to the surface of the at least one of the electrode unit and the wiring unit at least one time.

An area of the optical property modification layer modified by femtosecond-duration laser beam pulses may have a nanoscale or microscale size.

The at least one thin-film transistor includes a gate electrode, a source electrode, and a drain electrode, and the at least one capacitor includes an electrode.

The at least one wiring unit may include a gate wiring unit, a data wiring unit, and a power wiring unit.

Light emitted from the light-emitting layer may be emitted toward the second substrate, wherein the optical property modification layer is formed on the surface of the at least one of the electrode unit and the wiring unit that faces the second substrate, and wherein the organic light emitting display device comprises a second optical property modification layer having an optical property modified from that of the pixel electrode and formed on a surface of the pixel electrode close to the organic light-emitting layer.

The second optical property modification layer may have a reflectance that is lower than a reflectance of the pixel electrode.

The second optical property modification layer may have a light-absorptance that is higher than a light-absorptance of the pixel electrode.

Light emitted from the organic light-emitting layer may be emitted toward the first substrate, wherein the optical property modification layer is formed on the surface of the at least one of the electrode unit and the wiring unit that faces the first substrate, and wherein the organic light emitting display device comprises a second optical property modification layer having an optical property modified from that of the pixel electrode and formed on a surface of the common electrode close to the organic light-emitting layer.

The second optical property modification layer may have a reflectance that is lower than a reflectance of the common electrode.

The second optical property modification layer may have a light-absorptance that is higher than a light-absorptance of the common electrode.

The second optical property modification layer may be formed only on an area corresponding to the pixel electrode.

At least one of the first substrate and the second substrate may be a transparent substrate, wherein the organic light-emitting display device further includes a transparent interference layer that is disposed on a surface of the transparent substrate on which external light is incident.

The transparent interference layer may have a thickness equal to about ¼ of a wavelength of the external light.

The transparent interference layer may have a refractive index that is lower than a refractive index of the transparent substrate.

The transparent interference layer may include one material selected from the group consisting of magnesium fluoride, silica, a transparent material having a high refractive index, and a combination thereof.

The organic light-emitting display device further comprises a plurality of transparent interference layers disposed on a surface of the transparent substrate on which external light is incident, wherein the at least one transparent interference layer comprises a first transparent interference layer and a second transparent interference layer which is closer to the transparent substrate than the first transparent interference layer and has a refractive index greater than that of the first transparent interference layer.

Each transparent interference layer may have a thickness equal to about ¼ of a wavelength of the external light.

BRIEF DESCRIPTION OF THE DRAWINGS

The above and other features and advantages of the present invention will become more apparent by describing in detail embodiments thereof with reference to the attached drawings in which.

DETAILED DESCRIPTION OF EMBODIMENTS

Embodiments of the present invention will now be described more fully with reference to the accompanying drawings, in which embodiments of the invention are shown.

Figure 1:
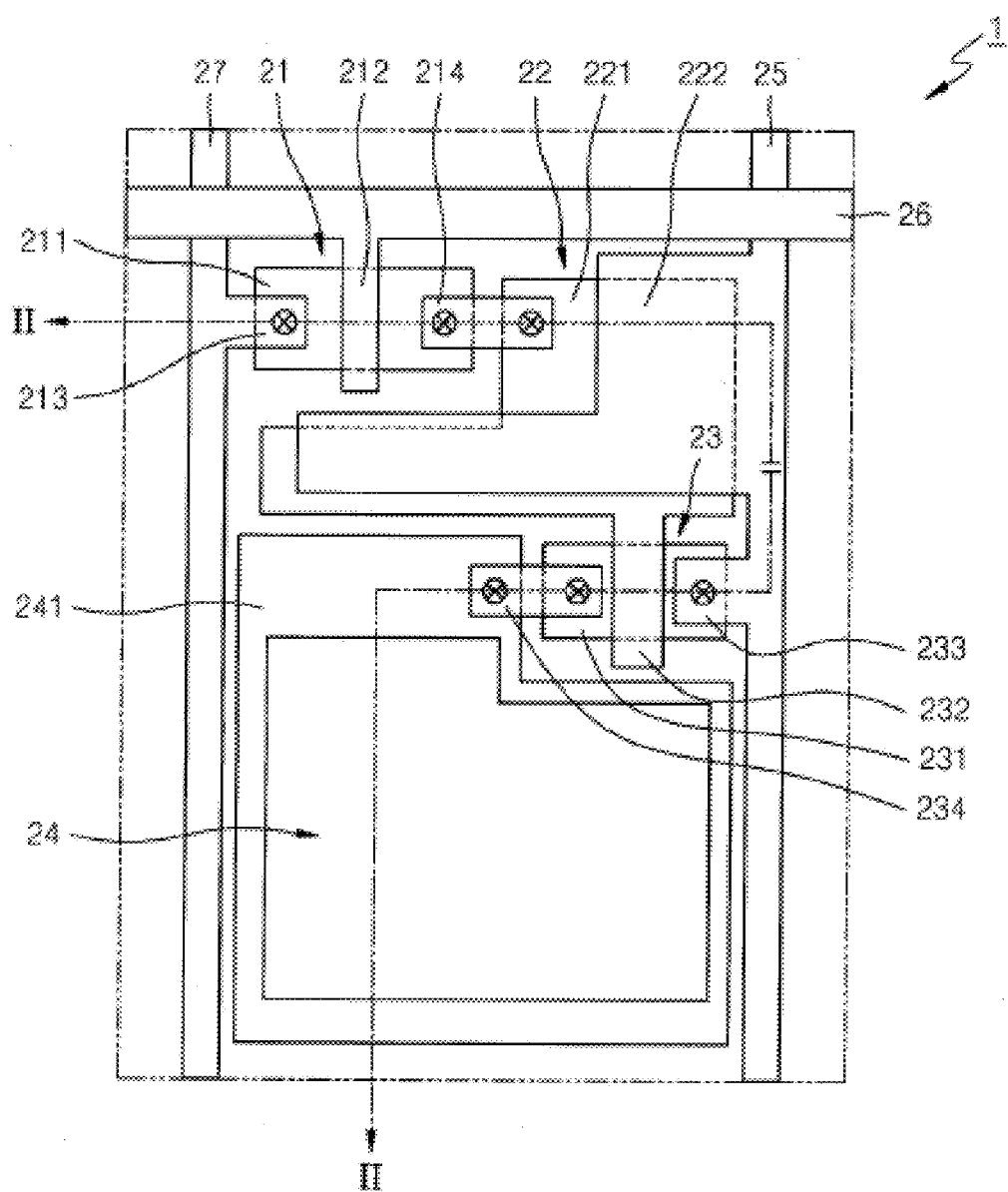
FIG. 1 is a plan view illustrating a pixel structure of an organic light-emitting display device.
Figure 2:
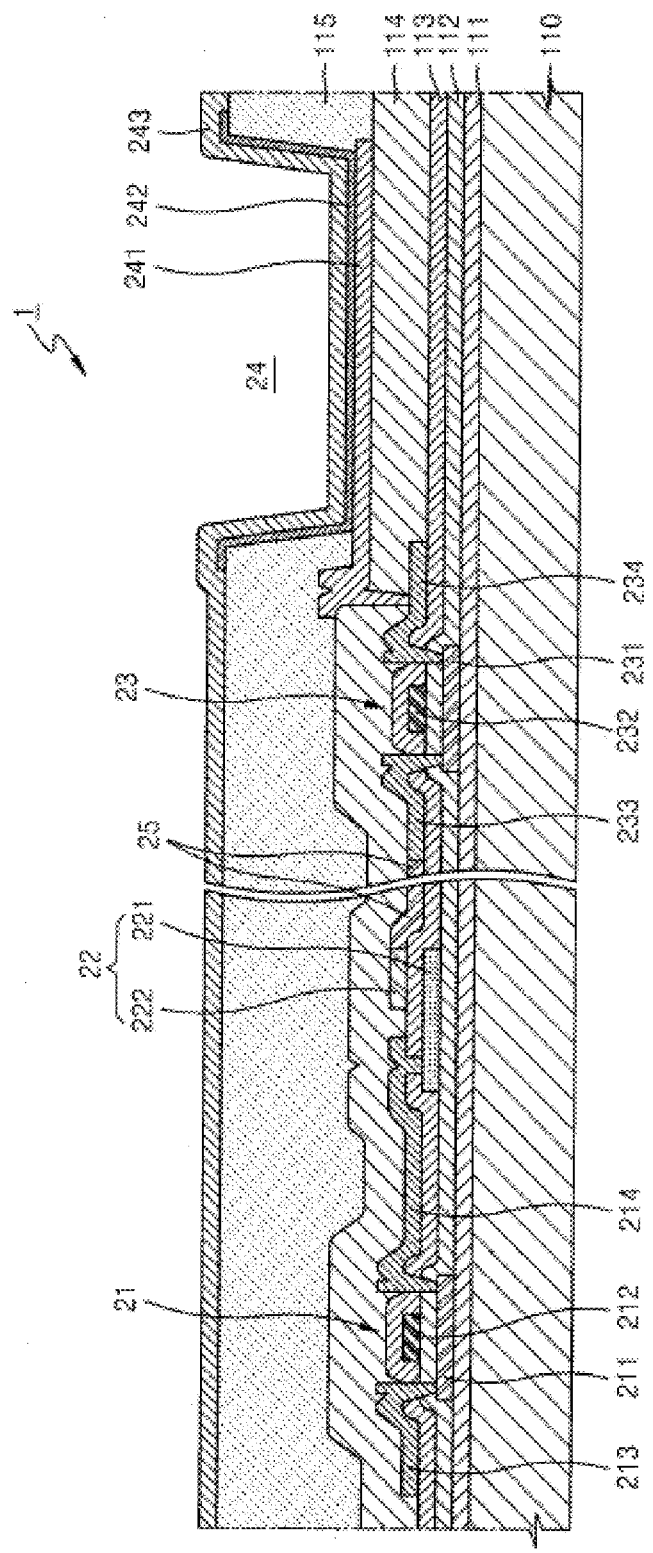
FIG. 2 is a cross-sectional view taken along line II-II of FIG. 1.
Figure 3:
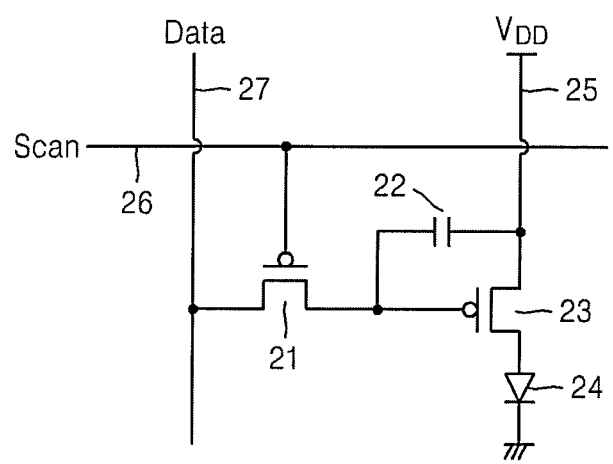
FIG. 3 is an equivalent circuit of the organic light-emitting display device of FIG. 1.

FIG. 1 is a plan view of an example of an organic light-emitting display device 1. FIG. 2 is a cross-sectional view taken along line II-II of FIG. 1. FIG. 3 is an equivalent circuit of the organic light-emitting display device 1 of FIG. 1.

Referring to FIGS. 1 through 3, the organic light-emitting display device 1 includes a gate wiring unit 26, a data wiring unit 27, and a power wiring unit 25 on a first substrate 110, and also includes a first thin-film transistor 21, a second thin-film transistor 23, and a capacitor 22. The second thin-film transistor 23 is connected to an organic light-emitting device 24, which includes a pixel electrode 241, a common electrode 243, and an organic light-emitting layer 242 disposed between the pixel electrode 241 and the common electrode 243.

In order to planarize the first substrate 110 and prevent impurity elements from penetrating into the first substrate 110, a buffer layer 111 formed of $SiO_2$ and/or SiNx may be disposed on the first substrate 110, A first active layer 211 of the first thin-film transistor 21 and a second active layer 231 of the second thin-film transistor 23 are formed on the buffer layer 111, and a gate insulating film 112 is formed on the first and second active layers 211 and 231. A first gate electrode 212 of the first thin-film transistor 21 and a second gate electrode 232 of the second thin-film transistor 23 are formed on the gate insulating film 112. The first gate electrode 212 is connected to the gate wiring unit 26, and the second gate electrode 232 is connected to a first electrode 221 of the capacitor 22. An interlayer insulating film 113 is formed on the first gate electrode 212, the second gate electrode 232, and the first electrode 221 of the capacitor 22. A first source electrode 213 and a first drain electrode 214 are respectively connected through contact holes to a source region (not shown) and a drain region (not shown) of the first active layer 211. A second source electrode 233 and a second drain electrode 234 are respectively connected to a source region (not shown) and a drain region (not shown) of the second active layer 221. The first source electrode 213 is connected to the data wiring unit 27 to apply a data signal to the first active layer 211, and the first drain electrode 214 is connected to the first electrode 221 of the capacitor 22 to store the data signal in the capacitor 22. The second source electrode 233 is connected to a second electrode 222 of the capacitor 22, and the second drain electrode 234 is connected to the pixel electrode 241 of the organic light-emitting device 24. A passivation layer 114 is formed on the first and second source electrodes 213 and 233, the first and second drain electrodes 214 and 234, and the second electrode 222 of the capacitor 22. The pixel electrode 241 is connected to the second drain electrode 234 through a via-hole in the passivation layer 114. A pixel defining layer 115 is formed over the passivation layer 114 and defines the light-emitting area(s) of the organic light-emitting display device 1.

The organic light-emitting device 24 includes the pixel electrode 241 separately formed for each pixel, the common electrode 243 facing the pixel electrode 241, and the organic light-emitting layer 242 disposed between the pixel electrode 241 and the common electrode 243.

If the organic light-emitting display device 1 is a top-emission type, the pixel electrode 241 may be a reflective electrode and the common electrode 243 may be a transparent electrode. On the contrary, if the organic light-emitting display device is a bottom-emission type, the pixel electrode 241 may be a transparent electrode and the common electrode 243 may be a reflective electrode.

In general, electrodes constituting the first and second thin-film transistors 21 and 23 and the capacitor 22 are formed of metals having a high reflectance, and wires connected to the first and second thin-film transistors 21 and 23 and the capacitor 22 are formed of metals having a high reflectance. Accordingly, external light incident on the organic light-emitting display device 1 from the outside is reflected by the electrodes and the wires disposed over the first substrate 110, and then is emitted together with light emitted from the organic light-emitting layer 242. The light reflected by the electrodes and the wires reduces the contrast of the organic light-emitting display device 1.

An organic light-emitting display device 2 according to an embodiment of the present invention will be explained with reference to FIGS. 4 and 5. The organic light-emitting display device 2 will be explained by focusing on differences from the organic light-emitting display device 1. The same elements as those in FIG. 1 are denoted by the same reference numerals.

Figure 4:
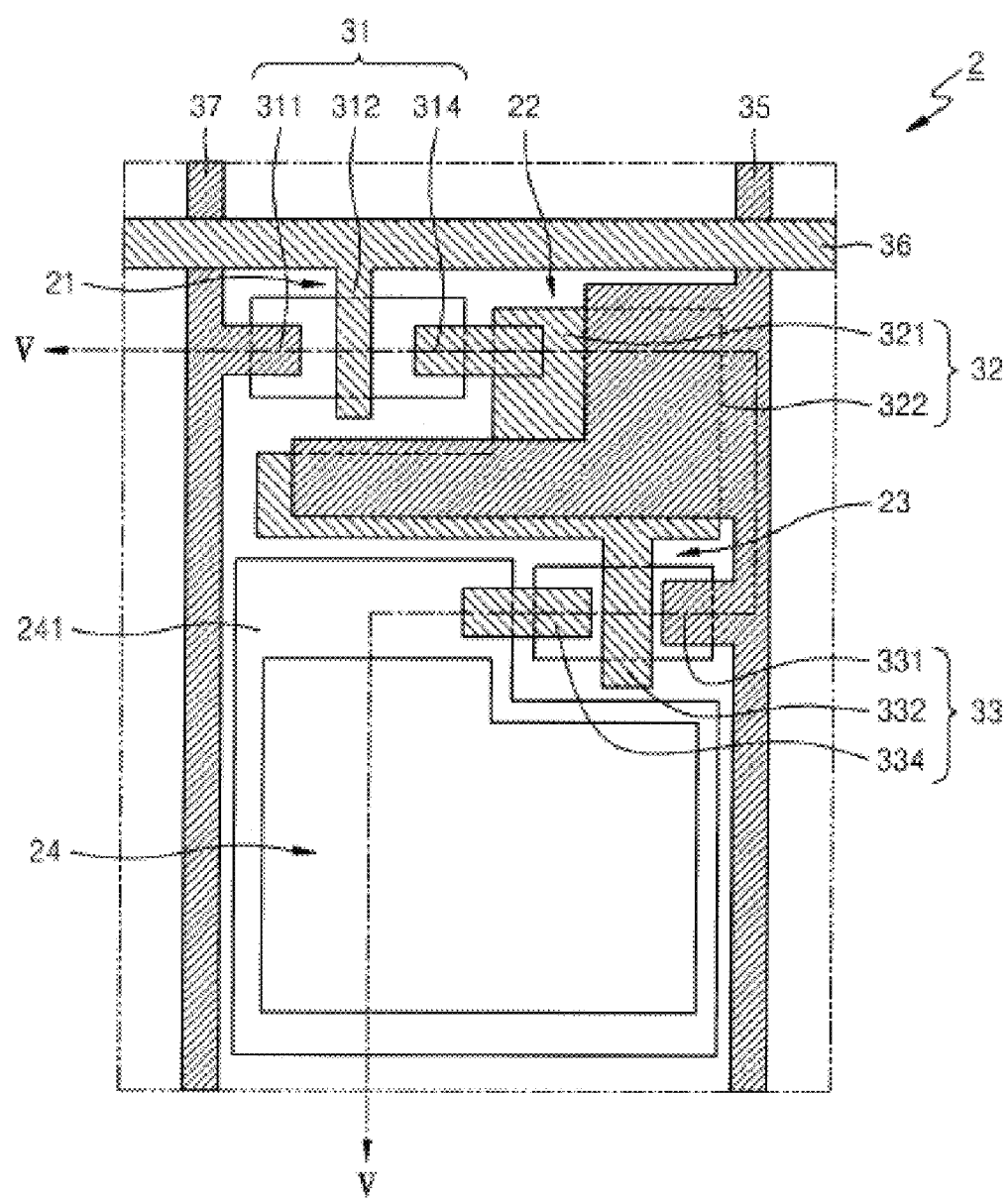
FIG. 4 is a plan view of an organic light-emitting display device according to an embodiment of the present invention.

FIG. 4 is a plan view of the organic light-emitting display device 2 that is a top-emission type, according to an embodiment of the present invention. FIG. 5 is a cross-sectional view taken along line V-V of FIG. 4.

Figure 5:
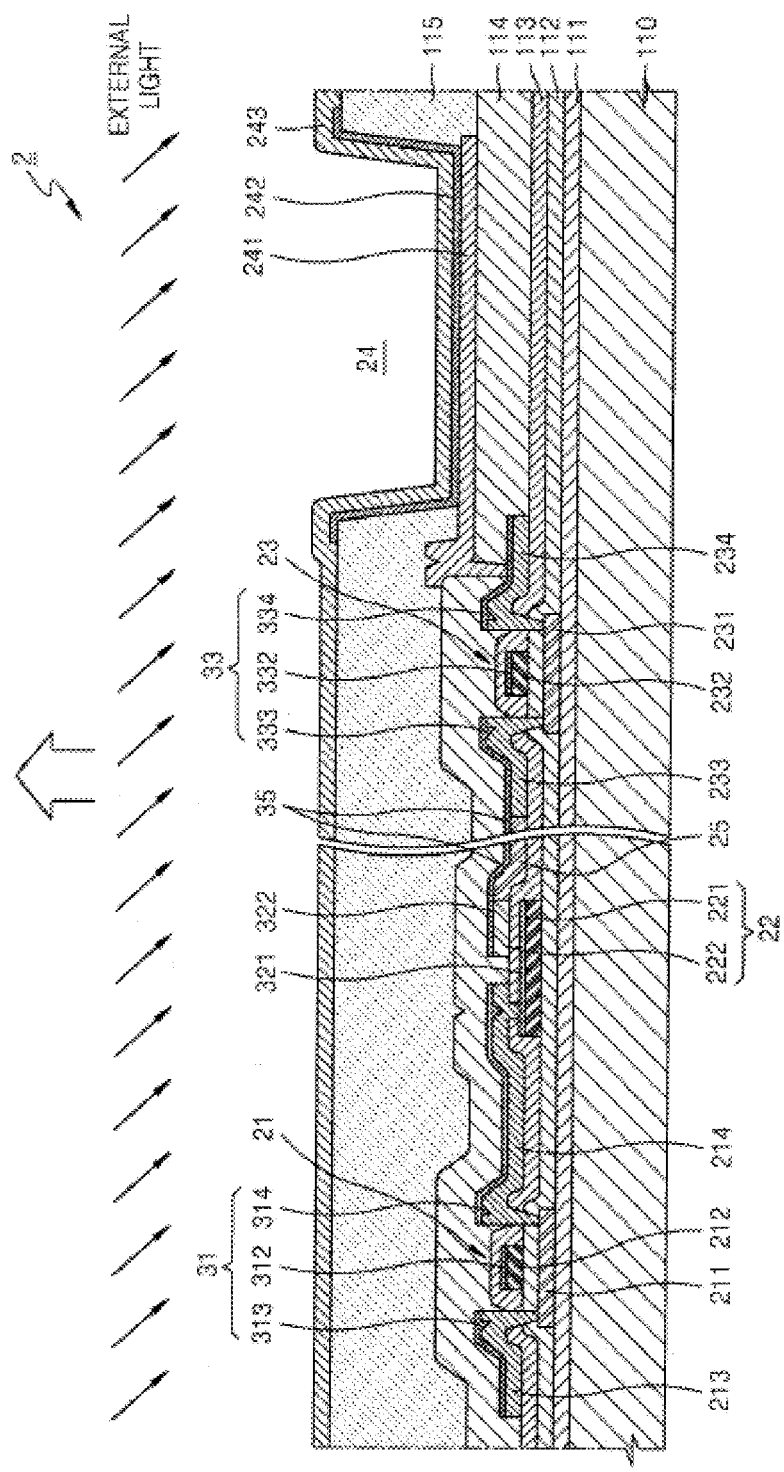
FIG. 5 is a cross-sectional view taken along line V-V of FIG. 4.

Referring to FIGS. 4 and 5, the organic light-emitting display device 2 includes the power wiring unit 25, the gate wiring unit 26, and the data wiring unit 27 on the first substrate 110, and also includes the first thin-film transistor 21, the capacitor 22, the second thin-film transistor 23, and the organic light-emitting device 24.

In embodiments, optical property modification layers 31, 32, 33, 35, 36, and 37 are obtained by modifying the optical properties of the wiring units 25, 26, and 27, the first and second gate electrodes 212 and 232 of the first and second thin-film transistors 21 and 23, the first and second source electrodes 213 and 233 of the first and second thin-film transistors 21 and 23, and the first and second drain electrodes 214 and 234 of the first and second thin-film transistors 21 and 23. Thus, each of the optical property modification layers 31, 32, 33, 35, 36, and 37 has optical properties modified and different from those of each of the wiring units 25, 26, and 27, the first and second gate electrodes 212 and 232 of the first and second thin-film transistors 21 and 23, the first and second source electrodes 213 and 233 of the first and second thin-film transistors 21 and 23, and the first and second drain electrodes 214 and 234 of the first and second thin-film transistors 21 and 23. Each of the optical property modification layers 31, 32, 33, 35, 36, and 37 is formed by treating a surface of each of the wiring units 25, 26, and 27, the first and second gate electrodes 212 and 232 of the first and second thin-film transistors 21 and 23, the first and second source electrodes 213 and 233 of the first and second thin-film transistors 21 and 23, and the first and second drain electrodes 214 and 234 of the first and second thin-film transistors 21 and 23.

In detail, the optical property modification layers 35, 36, and 37 are formed on the top surfaces of the power wiring unit 25, the gate wiring unit 26, and the data wiring unit 27, respectively. Optical property modification layers 312, 313, and 314 of the optical property modification layer 31 are formed on the top surfaces of the first gate electrode 212, the first source electrode 213, and the first drain electrode 214 of the first thin-film transistor 21, respectively. Optical property modification layers 332, 333, and 334 of the optical property modification layer 33 are formed on the top surfaces of the second gate electrode 232, the second source electrode 233, and the second drain electrode 234 of the second thin-film transistor 23, respectively. Optical property modification layers 321 and 322 of the optical property modification layer 32 are formed on the top surfaces of the first electrode 221 and the second electrode 222 of the capacitor 22, respectively.

The optical property modification layers 31, 32, 33, 35, 36, and 37 are formed on the wiring units 25, 26, and 27 and the top surfaces of the electrodes 212, 213, 214, 232, 233, 234, 221, and 222 of the thin film transistors 21 and 23, and the capacitor 22, and are obtained by modifying optical properties of the wiring units 25, 26, and 27 and the electrodes 212, 213, 214, 232, 233, 234, 221, and 222. For example, the optical property modification layers 31, 32, 33, 35, 36, and 37 may be obtained by modifying at least one optical property from among a reflectance, a light-absorptance, a transmittance, a refractive index, a diffraction, and a color of metal materials for constituting the wiring units 25, 26, and 27 and the electrodes 212, 213, 214, 232, 233, 234, 221, and 222. In FIG. 4, the optical property modification layers 31, 32, 33, 35, 36, and 37 may have a reflectance lower than that of metal materials and a light-absorptance higher than that of metal materials for constituting the wiring units 25, 26, and 27 and the electrodes 212, 213, 214, 232, 233, 234, 221, and 222.

In the organic light-emitting display device 2 that is a top-emission type where an image is formed away from the first substrate 110, external light that enters the organic light-emitting display device 2 may be reflected by surfaces of the electrodes 212, 213, 214, 232, 233, 234, 221, and 222 and the wiring units 25, 26, and 27, thereby reducing the contrast of light emitted from the organic light-emitting layer 242. However, the optical property modification layers 31, 32, 33, 35, 36, and 37 are formed on surfaces of the electrodes 212, 213, 214, 232, 233, 234, 221, and 222 and the wiring units 25, 26, and 27, which face away from the first substrate 10. Thus, the amount of external light reflected by the electrodes 212, 213, 214, 232, 233, 234, 221, and 222 and the wiring units 25, 26, and 27 may be reduced, thereby improving contrast.

In WO 2008/097374 of Chunlei et al., published on Aug. 14, 2008, entitled "Ultra-short duration laser methods for the nanostructuring of materials", which is incorporated by reference herein, a method of modifying the optical properties of materials is disclosed. According to the above method, the application of femtosecond-duration laser beam pulses to a metal may change the surface structure of the metal such that the modified structure of the metal can have a nanoscale or microscle size, and the optical property of the surface layer of the metal can be modified. In embodiments, the metal can be exposed to femtosecond-duration laser beam pulses at least once to obtain the modified structure change of the metal.

Figure 6:
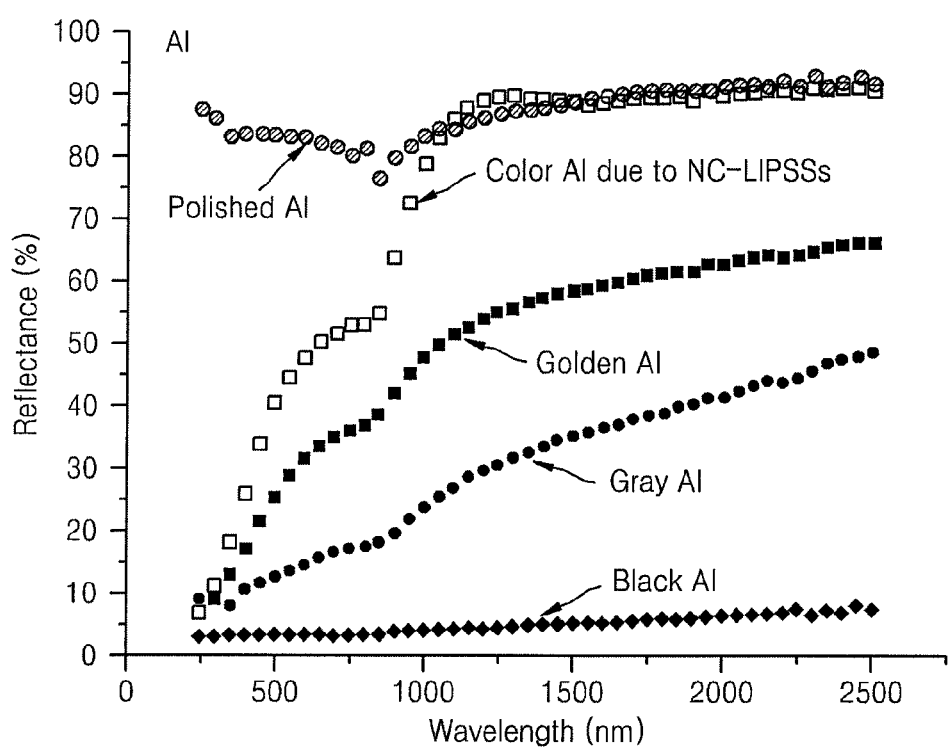
FIG. 6 is a graph illustrating a relationship between a reflectance and a wavelength when femtosecond-duration laser beam pulses are applied to aluminum.

FIG. 6 is a graph illustrating a relationship between a reflectance and a wavelength when 65 femtosecond pulses of about 0.1 mJ/pulse with a central wavelength at 800 nm generated by a Ti:sapphire laser system are applied to aluminum. Referring to FIG. 6, when the wavelength ranges from 250 nm to 2500 nm, a reflectance of polished aluminum (Al) having a treated surface is higher than the reflectance of golden aluminum, Gray Al, and Black Al having untreated surfaces. Of course, it is found that a color of a surface of aluminum is changed.

Accordingly, when aluminum is used for the wiring units 25, 26, and 27 and the electrodes 212, 213, 214, 232, 233, 234, 221, and 222 of the organic light-emitting display device 2, such surface treatment is performed by using the afore-described femtosecond laser beam technology on the top surfaces of the wiring units 25, 26, and 27 and the electrodes 212, 213, 214, 232, 233, 234, 221, and 222 can change the optical properties of the top surfaces of the wiring units 25, 26, and 27 and the electrodes 212, 213, 214, 232, 233, 234, 221, and 222. In other words, a treated surface of aluminum having a lower reflectance or a higher light-absorptance than an untreated surface of aluminum forms the optical property modification layers 31, 32, 33, 35, 36, and 37 on the top surfaces of the wiring units 25, 26, and 27 and the electrodes 212, 213, 214, 232, 233, 234, 221, and 222. Thus, the amount of external light reflected by the wiring units 25, 26, and 27 and the electrodes 212, 213, 214, 232, 233, 234, 221, and 222 may be reduced.

Accordingly, without using an expensive polarization plate and without forming a black matrix by performing an additional masking process, contrast may be improved by simply modifying the optical properties of the wiring units 25, 26, and 27 and the electrodes 212, 213, 214, 232, 233, 234, 221, and 222.

Although two thin-film transistors 21 and 23 and one capacitor 22 constitute one pixel in FIGS. 4 through 5, the present embodiment is not limited thereto. Accordingly, thin-film transistors and capacitors may be combined in various ways. Also, although the power wiring unit 25, the gate wiring unit 26, and the data wiring unit 27 intersect each other perpendicularly in each pixel in FIGS. 4 through 5, the present embodiment is not limited thereto, and various modifications may be made according to a design rule.

An organic light-emitting display device 3 that is a top-emission type, according to another embodiment of the present invention, will be explained with reference to FIGS. 7 and 8. The organic light-emitting display device 3 will be explained by focusing on differences from the organic light-emitting display device 2, and the same elements as those in FIGS. 4 through 5 are denoted by the same reference numerals.

Figure 7:
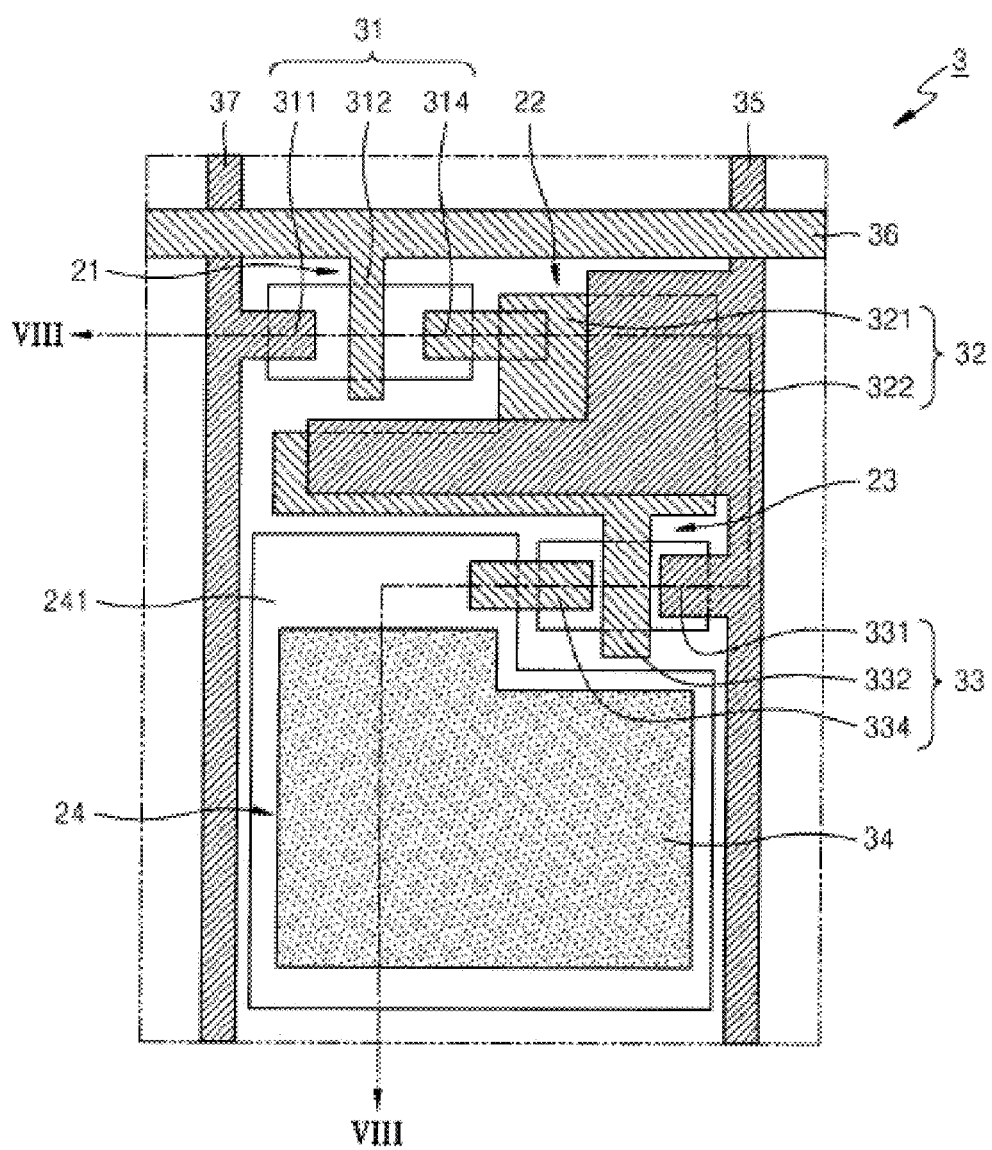
FIG. 7 is a plan view of an organic light-emitting display device according to another embodiment of the present invention.

FIG. 7 is a plan view of the organic light-emitting display device 3 according to another embodiment of the present invention. FIG. 8 is a cross-sectional view taken along line VIII-VIII of FIG. 7.

Figure 8:
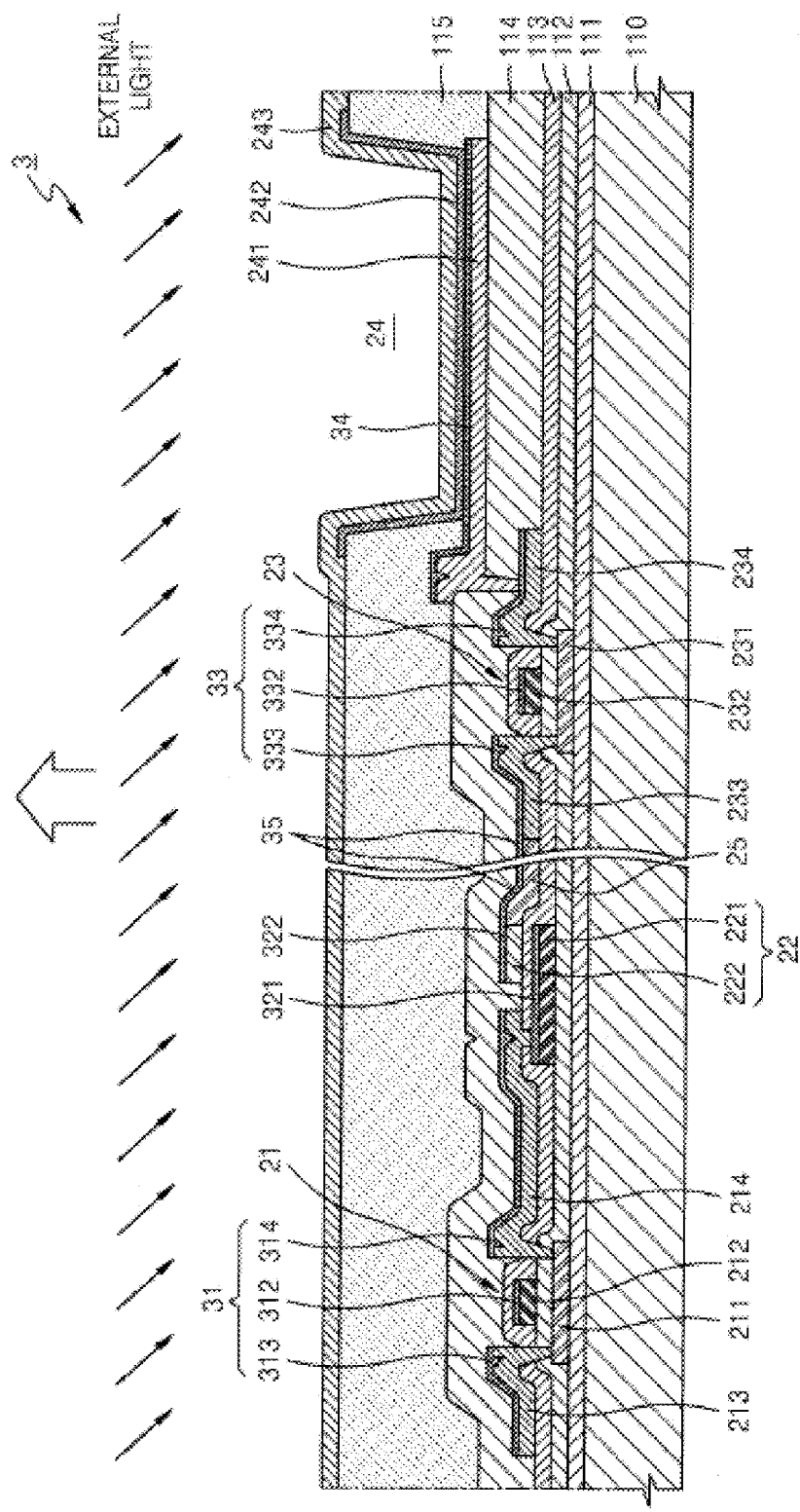
FIG. 8 is a cross-sectional view taken along line VIII-VIII of FIG. 7.

Referring to FIGS. 7 and 8, the organic light-emitting display device 3 includes the power wiring unit 25, the gate wiring unit 26, and the data wiring unit 27 on the first substrate 110, and also includes the first thin-film transistor 21, the capacitor 22, the second thin-film transistor 23, and the organic light-emitting device 24.

The optical property modification layers 31, 32, 33, 35, 36, and 37 obtained by modifying the optical properties of the wiring units 25, 26, and 27, the first and second gate electrodes 212 and 232 of the first and second thin-film transistors 21 and 23, the first and second source electrodes 213 and 233 of the first and second thin-film transistors 21 and 23, and the first and second drain electrodes 214 and 234 of the first and second thin-film transistors 21 and 23 are disposed on top surfaces of the wiring units 25, 26, and 27, the first and second gate electrodes 212 and 232 of the first and second thin-film transistors 21 and 23, the first and second source electrodes 213 and 233 of the first and second thin-film transistors 21 and 23, and the first and second drain electrodes 214 and 234 of the first and second thin-film transistors 21 and 23.

Also, in the illustrated embodiments, an optical property modification layer 34 is disposed on a top surface of the pixel electrode 241.

In the organic light-emitting display device 3 that is a top-emission type, the pixel electrode 241 is a reflective electrode. Accordingly, external light incident on the organic light-emitting display device 3 may be reflected by the top surface of the pixel electrode 241 and then may be emitted along with light emitted from the organic light-emitting layer 242. The external light reflected by the top surface of the pixel electrode 241 may reduce contrast of the organic light-emitting display device 3.

However, in the organic light-emitting display device 3 of FIGS. 7 and 8, since the optical property modification layer 34 having a reflectance lower than that of the pixel electrode 241 or a light-absorptance higher than that of the pixel electrode 241 is formed on the top surface of the pixel electrode 241 that is a reflective electrode, the amount of external light reflected by the pixel electrode 241 may be reduced.

Of course, like in FIGS. 4 and 5, since the optical property modification layers 31, 32, 33, 35, 36, and 37 having a reflectance lower than or a light-absorptance higher than that of the wiring units 25, 26, and 27 and the electrodes 212, 213, 214, 232, 233, 234, 221, and 222 are respectively formed on the top surfaces of the wiring units 25, 26, and 27 and the electrodes 212, 213, 214, 232, 233, 234, 221, and 222, the amount of external light reflected by the wiring units 25, 26, and 27 and the electrodes 212, 213, 214, 232, 233, 234, 221, and 222 may be reduced.

An organic light-emitting display device 4 that is a top-emission type, according to another embodiment of the present invention, will be explained with reference to FIGS. 9 through 11. The organic light-emitting display device 4 will be explained by focusing on differences from the organic light-emitting display device 3 of FIGS. 7 and 8. The same elements as those in FIGS. 7 and 8 are denoted by the same reference numerals.

Figure 9:
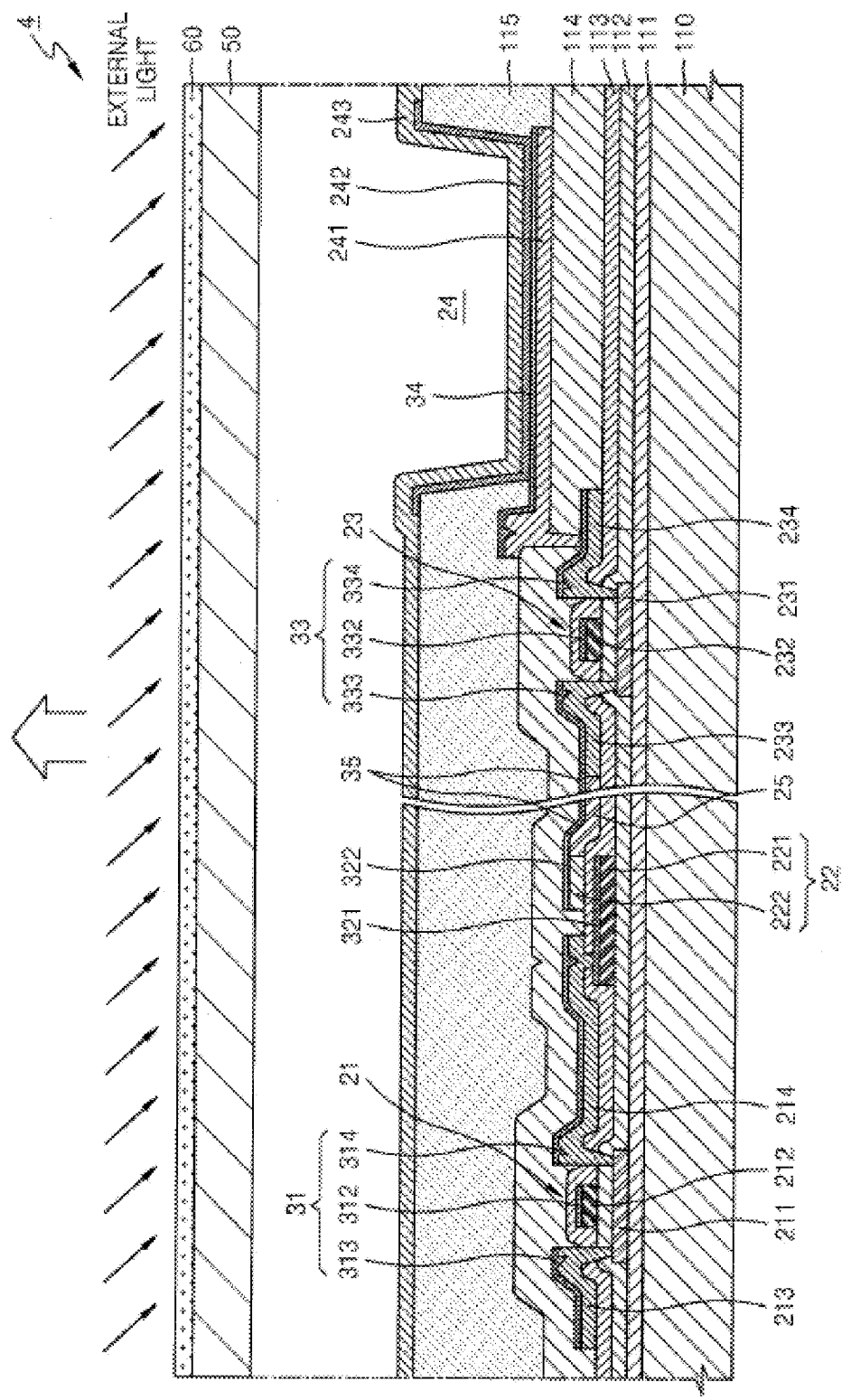
FIG. 9 is a cross-sectional view of an organic light-emitting display device according to another embodiment of the present invention.

FIG. 9 is a plan view of the organic light-emitting display device 4 according to another embodiment of the present invention. FIG. 10 is a cross-sectional view illustrating a transparent interference layer 60. FIG. 11 is a cross-sectional view illustrating first through third transparent interference layers 61, 62, and 63.

Referring to FIG. 9, the organic light-emitting display device 4 includes the power wiring unit 25, the gate wiring unit 26, and the data wiring unit 27 on the first substrate 110, and also includes the first thin-film transistor 21, the capacitor 22, the second thin-film transistor 23, and the organic light-emitting device 24.

The optical property modification layers 31, 32, 33, 34, 35, 36, and 37 obtained by modifying the optical properties of the wiring units 25, 26, and 27, the first and second gate electrodes 212 and 232 of the first and second thin-film transistors 21 and 23, the first and second source electrodes 213 and 233 of the first and second thin-film transistors 21 and 23, the first and second drain electrodes 214 and 234 of the first and second thin-film transistors 21 and 23, and the pixel electrode 241 are disposed on top surfaces of the wiring units 25, 26, and 27, the first and second gate electrodes 212 and 232 of the first and second thin-film transistors 21 and 23, the first and second source electrodes 213 and 233 of the first and second thin-film transistors 21 and 23, the first and second drain electrodes 214 and 234 of the first and second thin-film transistors 21 and 23, and the pixel electrode 241, respectively.

Also, the transparent interference layer 60 is disposed on a surface of a second substrate 50.

The transparent interference layer 60 is disposed on a surface of the second substrate 50, which is a transparent substrate, on which external light is incident. The external light enters the organic light-emitting display device 4 by passing through the second substrate 50, but part of the external light is directly reflected by the surface of the second substrate 50. Accordingly, the light reflected by the surface of the second substrate 50 may enter an observer's eyes along with light emitted from the organic light-emitting layer 242, and may reduce contrast.

Figure 10:
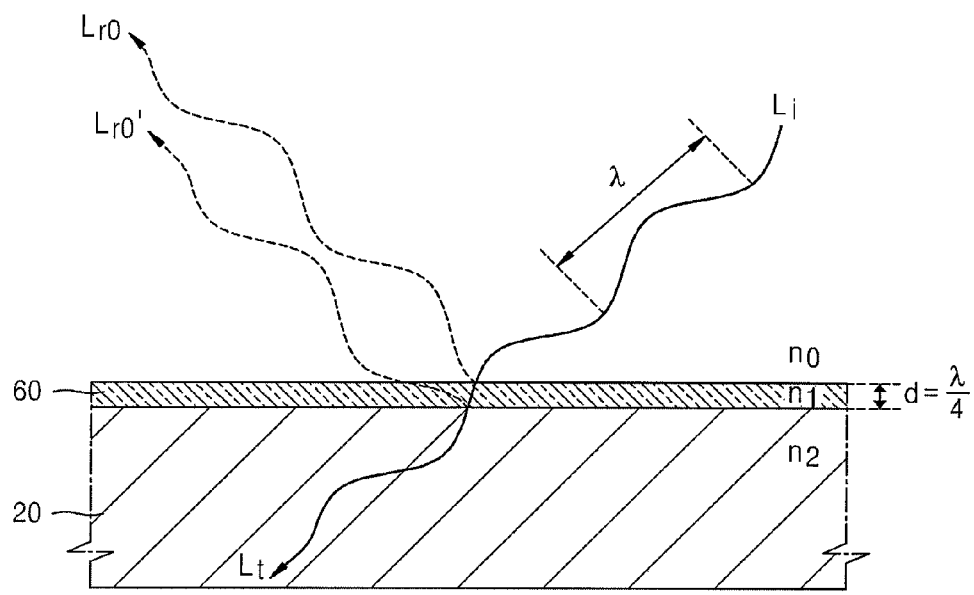
FIG. 10 is a cross-sectional view illustrating a transparent interference layer.
Figure 11:
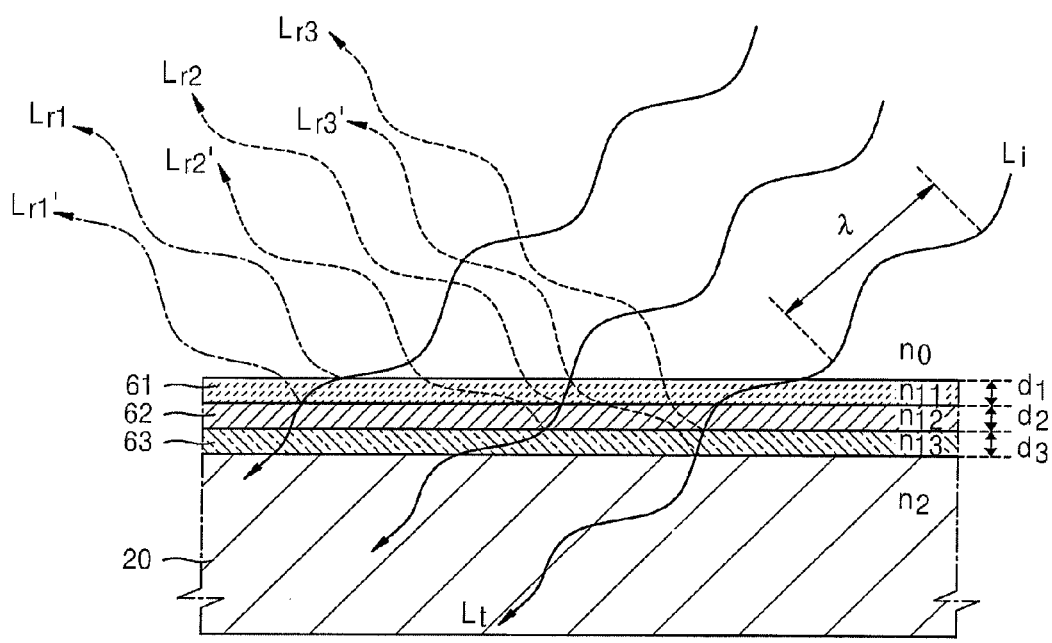
FIG. 11 is a cross-sectional view illustrating a plurality of transparent interference layers.

However, in the organic light-emitting display device 4 of FIGS. 9 through 11, since the transparent interference layer 60 having a thickness corresponding to ¼ of a wavelength of the external light is disposed on the surface of the second substrate 50, the amount of external light reflected by the surface of the substrate 50 may be reduced.

Referring to FIG. 10, part $L_t$ of external light $L_i$ passes through the transparent interference layer 60 from the air and is incident on the second substrate 50, and part $L_{r0}$ of the external light $L_i$ is reflected by a surface of the transparent interference layer 60. Also, part $L_{r0}'$ of the light $L_t$ is reflected at a boundary between the second substrate 50 and the transparent interference layer 60. In this case, if a thickness 'd' of the transparent interference layer 60 corresponds to ¼ of a wavelength λ of the external light $L_i$, the light $L_{r0}$ reflected by the transparent interference layer 60 and the light $L_{r0}'$ reflected by the second substrate 50 are offset due to interference, thus the amount of external light reflected on a surface of the second substrate 50 can be reduced.

In this case, the thickness 'd' of the transparent interference layer 60 may be determined in various ways, for example, based on a wavelength of external light, by using an arithmetical mean of wavelengths defining a visible spectrum of light, or an arithmetical mean of wavelengths defining a spectrum of external light.

It is preferable that the transparent interference layer 60 has a refractive index $n_1$ between a refractive index $n_0=1$ of air and a refractive index $n_2$ of the second substrate 50. If the second substrate 50 is a general glass having a refractive index $n_1$ of about 1.5, in one embodiment, the refractive index $n_1$ of the transparent interference layer 60 can be about 1.23, but it is difficult to find a material having an appropriate refractive index.

In the present embodiment, the transparent interference layer 60 is formed of magnesium fluoride having a refractive index of about 1.38. Magnesium fluoride has high durability and is easily deposited by physical vapour deposition (PVD). Alternatively, the transparent interference layer 60 may be formed of silica or any of various transparent materials having a high refractive index.

In FIG. 11, the first through third transparent interference layers 61, 62, and 63 are disposed on a surface of the second substrate 50.

Referring to FIG. 11, part $L_t$ of external light $L_i$ passes through the first through third transparent interference layers 61, 62, and 63 from the air and is incident on the second substrate 50. The nearer to the second substrate 50 the transparent interface layer is disposed, the greater the refractive index of the transparent interference layer is. In the illustrated embodiments, the refractive index n13 of the transparent interference layer 63 is greater than the refractive indices n11 and n12 of the transparent interference layers 61 and 62, and the refractive index n12 of the transparent interference layer 62 is greater than the refractive index n11 of the transparent interference layer 61. This can be expressed as n11<n12<n13.

Part $L_{r1}$ of the external light $L_i$ is reflected by the first transparent interference layer 61, and part $L_{r1}'$ of the light $L_t$ is reflected at a boundary between the second transparent interference layer 62 and the first transparent interference layer 61. In this case, if a thickness d1 of the first transparent interference layer 61 corresponds to ¼ of a wavelength λ of the external light $L_i$, the light $L_{r1}$ reflected by the first transparent interference layer 61 and the light $L_{r1}'$ reflected at the boundary between the second transparent interference layer 62 and the first transparent interference layer 61 are offset due to interference.

Part $L_{r2}$ of the external light $L_i$ is reflected by the second transparent interference layer 62, and part $L_{r2}'$ of the light $L_t$ is reflected at a boundary between the third transparent interference layer 63 and the second transparent interference layer 62. In this case, if a thickness d2 of the second transparent interference layer 62 corresponds to ¼ of the wavelength λ of the external light $L_i$, the light $L_{r2}$ reflected by the second transparent interference layer 62 and the light $L_{r2}'$ reflected at the boundary between the third transparent interference layer 63 and the second transparent interference layer 62 are offset due to interference.

Part $L_{r3}$ of the external light $L_i$ is reflected by the third transparent interference layer 63, and part $L_{r3}'$ of the light $L_t$ is reflected at a boundary between the second substrate 50 and the third transparent interference layer 63. In this case, if a thickness d3 of the third transparent interference layer 63 corresponds to ¼ of the wavelength λ of the external light $L_i$, the light $L_{r3}$ reflected by the third transparent interference layer 63 and the light $L_{r3}'$ reflected at the boundary between the second substrate 50 and the third transparent interference layer 63 are offset due to interference. Accordingly, the amount of external light reflected is reduced and thus contrast is improved.

An organic light-emitting display device 5 according to another embodiment of the present invention will be explained with reference to FIG. 12. The organic light-emitting display device 5 will be explained by focusing on differences from the organic light-emitting display device 4 of FIGS. 9 through 11. The same elements as those in FIGS. 9 through 11 are denoted by the same reference numerals.

Figure 12:
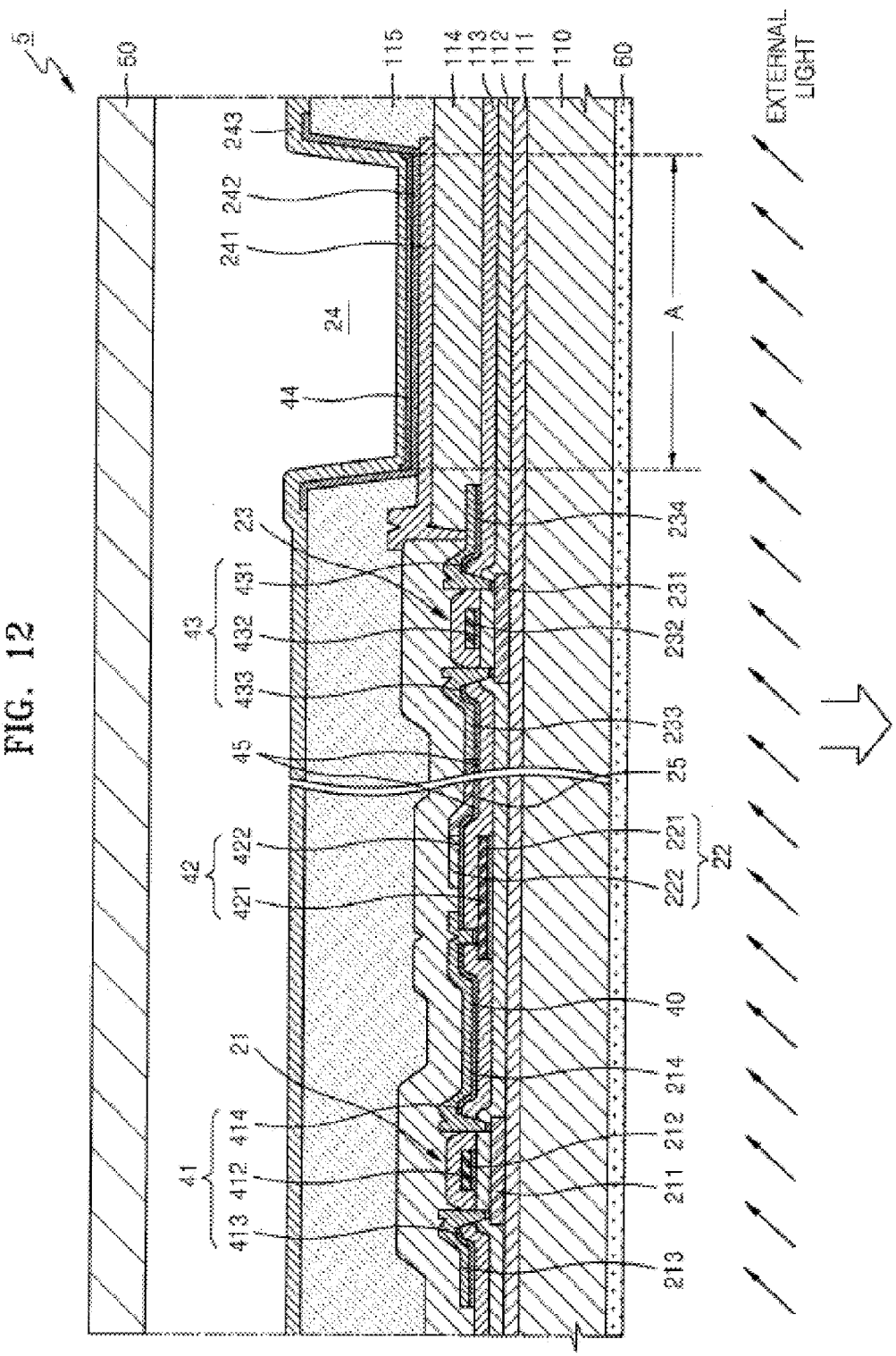
FIG. 12 is a cross-sectional view of an organic light-emitting display device according to another embodiment of the present invention.

FIG. 12 is a cross-sectional view of the organic light-emitting display device 5 that is a bottom-emission type, according to another embodiment of the present invention.

Referring to FIG. 12, the organic light-emitting display device 5 includes the power wiring unit 25, the gate wiring unit 26, and the data wiring unit 27 on the first substrate 110, and also includes the first thin-film transistor 21, the capacitor 22, the second thin-film transistor 23, and the organic light-emitting device 24.

Since the organic light-emitting display device 5 is a bottom-emission type where light is emitted from the organic light-emitting layer 242 toward the first substrate 110, the first substrate 110 is a transparent substrate. The common electrode 243 is a reflective electrode, and the pixel electrode 241 is a transparent electrode.

External light that enters the organic light-emitting display device 5 through the first substrate 110 may be reflected by electrodes and wiring units having a higher reflectance, and then may be emitted along with light emitted from the organic light-emitting layer 242, thereby reducing contrast.

Accordingly, in the organic light-emitting display device 5, since optical property modification layers 41, 42, 43, 45, 46, and 47 obtained by modifying the optical properties of the wiring units 25, 26, and 27, the first and second gate electrodes 212 and 232 of the first and second thin-film transistors 21 and 23, the first and second source electrodes 213 and 233 of the first and second thin-film transistors 21 and 23, and the first and second drain electrodes 214 and 234 of the first and second thin-film transistors 21 and 23 are disposed on bottom surfaces of the wiring units 25, 26, and 27, the first and second gate electrodes 212 and 232 of the first and second thin-film transistors 21 and 23, the first and second source electrodes 213 and 233 of the first and second thin-film transistors 21 and 23, and the first and second drain electrodes 214 and 234 of the first and second thin-film transistors 21 and 23, the amount of external light reflected by the wiring units 25, 26, and 27 and the electrodes 212, 213, 214, 232, 233, and 234 may be reduced.

Also, an optical property modification layer 44 obtained by modifying an optical property of the common electrode 243 is formed on a surface of the common electrode 243, which is a reflective electrode, facing the organic light-emitting layer 242. Accordingly, since the optical property modification layer 44 has a reflectance lower than that of the common electrode 243 or a light-absorptance higher than that of the common electrode 243, the amount of external light reflected by the common electrode 213 that is a reflective electrode may be reduced. Although the optical property modification layer 44 may be formed on an entire area of the common electrode 243, the optical property modification layer 44 may be formed on a part A corresponding to an area where the organic light-emitting layer 242 is to be formed, as shown in FIG. 12.

Also, the transparent interference layer 60 is disposed on a surface of the first substrate 110, which is a transparent substrate, on which external light is incident. The transparent interference layer 60 may reduce the amount of external light directly reflected by the surface of the first substrate 110, and improve contrast.

As described above, an organic light-emitting display device according to the one or more embodiments of the present invention has the following effects:

First, since optical property modification layers are formed on surfaces of electrodes and wiring units, the amount of external light reflected by the electrodes and the wiring units may be reduced and contrast may be improved.

Second, since an optical property modification layer is formed on a surface of a reflective electrode, the amount of external light reflected by the reflective electrode may be reduced, and contrast reduction may be minimized.

Third, since a transparent interference layer is formed on a transparent substrate of the organic light-emitting display device, the amount of external light reflected by the transparent substrate may be reduced and contrast may be prevented from being reduced.

While embodiments of the present invention have been particularly shown and described, it will be understood by those of ordinary skill in the art that various changes in form and details may be made therein without departing from the spirit and scope of the present invention as defined by the following claims.

What is claimed is:

1. An organic light-emitting display device comprising:
   a first substrate and a second substrate;
   an array of a plurality of pixels disposed between the first and second substrates, each pixel comprising an organic light-emitting device, the array comprising a pixel defining layer defining a plurality of light-emitting areas corresponding to the plurality of pixels, wherein light from the organic light-emitting device is emitted toward the first substrate;
   a thin film transistor (TFT) electrically connected to the organic light-emitting device and the TFT comprising a metallic electrode; and
   the metallic electrode comprising a laser-treated surface on the side facing the first substrate, wherein the laser-treated surface has an optical property that is different from that of the same surface but for a laser-treatment.

2. The organic light-emitting display device of claim 1, wherein the laser-treated surface has a reflectance that is lower than a reflectance of the surface before the laser-treatment.

3. The organic light-emitting display device of claim 1, wherein the laser-treated surface has a light-absorptance that is higher than a light-absorptance of the surface before the laser-treatment.

4. The organic light-emitting display device of claim 1, wherein the laser-treated surface is different from the surface before the laser-treatment in terms of at least one optical property selected from the group consisting of a transmittance, a refractive index, a diffraction, and a color.

5. The organic light-emitting display device of claim 1, wherein the laser-treatment comprises applying femtosecond-duration laser beam pulses to the surface of the metallic electrode at least one time.

6. The organic light-emitting display device of claim 5, wherein an area of the surface of the metallic electrode modified by femtosecond-duration laser beam pulses has a nanoscale or microscale size.

7. The organic light-emitting display device of claim 1, further comprising a capacitor having an electrode, wherein the TFT comprises a gate electrode, a source electrode, and a drain electrode.

8. The organic light-emitting display device of claim 1, wherein the metallic electrode comprises a gate wiring unit, a data wiring unit, or a power wiring unit.

9. The organic light-emitting display device of claim 1, wherein the organic light emitting device comprises a pixel electrode separately formed in each pixel, a common electrode facing the pixel electrode, and an organic light-emitting layer disposed between the pixel electrode and the common electrode, and wherein the pixel electrode has a surface facing the organic light-emitting layer, wherein the surface is laser-treated to provide an optical property that is different from that of the same surface but for a laser-treatment.

10. The organic light-emitting display device of claim 9, wherein the laser-treated surface of the pixel electrode has a reflectance that is lower than a reflectance of the pixel electrode before the laser-treatment.

11. The organic light-emitting display device of claim 9, wherein the laser-treated surface of the pixel electrode has a light-absorptance that is higher than a light-absorptance of the pixel electrode before the laser-treatment.

12. The organic light-emitting display device of claim 1, wherein at least one of the first substrate and the second substrate is a transparent substrate, wherein the organic light-emitting display device further comprises at least one transparent interference layer that is disposed on a surface of the transparent substrate on which external light is incident.

13. The organic light-emitting display device of claim 12, wherein the at least one transparent interference layer has a thickness equal to about ¼ of a wavelength of the external light.

14. The organic light-emitting display device of claim 12, wherein the at least one transparent interference layer has a refractive index that is lower than a refractive index of the transparent substrate.

15. The organic light-emitting display device of claim 12, wherein the at least one transparent interference layer comprises one material selected from the group consisting of magnesium fluoride, silica, a transparent material having a high refractive index, and a combination thereof.

16. The organic light-emitting display device of claim 12, wherein the at least one transparent interference layer comprises a first transparent interference layer and a second transparent interference layer which is closer to the transparent substrate than the first transparent interference layer and has a refractive index greater than that of the first transparent interference layer.

17. The organic light-emitting display device of claim 12, wherein the at least one transparent interference layer comprises a plurality of the transparent interference layers and each transparent interference layer has a thickness equal to about ¼ of a wavelength of the external light.

\* \* \* \* \*